United States Patent
Yang et al.

(10) Patent No.: US 9,595,497 B2
(45) Date of Patent: Mar. 14, 2017

(54) DISPLAY WITH LOW REFLECTIVITY ALIGNMENT STRUCTURES

(71) Applicant: Apple Inc., Cupertino, CA (US)

(72) Inventors: Byung Duk Yang, Cupertino, CA (US); Kwang Soon Park, Cupertino, CA (US); Kyung-Wook Kim, Cupertino, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 176 days.

(21) Appl. No.: 14/494,529

(22) Filed: Sep. 23, 2014

(65) Prior Publication Data

US 2015/0362770 A1   Dec. 17, 2015

Related U.S. Application Data

(60) Provisional application No. 62/012,122, filed on Jun. 13, 2014.

(51) Int. Cl.
| | | |
|---|---|---|
| *G02F 1/1333* | (2006.01) | |
| *H01L 23/544* | (2006.01) | |
| *G02F 1/1335* | (2006.01) | |
| *G02F 1/1345* | (2006.01) | |

(52) U.S. Cl.
CPC .......... *H01L 23/544* (2013.01); *G02F 1/1333* (2013.01); *G02F 1/133512* (2013.01); *G02F 1/13454* (2013.01); *G02F 2001/133354* (2013.01); *H01L 2223/5442* (2013.01); *H01L 2223/54426* (2013.01); *H01L 2223/54486* (2013.01); *H01L 2924/0002* (2013.01)

(58) Field of Classification Search
CPC . H01L 23/544; G02F 1/1333; G02F 1/133512
See application file for complete search history.

(56) References Cited

U.S. PATENT DOCUMENTS

| | | | |
|---|---|---|---|
| 8,293,319 B2 | 10/2012 | Ikeda et al. | |
| 8,310,608 B2 | 11/2012 | Yoshida et al. | |
| 2003/0053056 A1* | 3/2003 | Ohazama | G01R 31/043 356/401 |
| 2006/0076881 A1* | 4/2006 | Kim | G02F 1/133617 313/496 |

(Continued)

*Primary Examiner* — James Dudek
(74) *Attorney, Agent, or Firm* — Treyz Law Group, P.C.; G. Victor Treyz; Zachary D. Hadd

(57) ABSTRACT

A display may have a thin-film transistor layer formed from a layer of thin-film, transistor circuitry on a substrate. The thin-film transistor layer may overlap a color filter layer. A portion of the thin-film transistor layer may extend past the color filter layer to for a ledge region. Components such as a flexible printed circuit and a display driver integrated circuit may be mounted to the thin-film transistor layer in the ledge region. The components may have alignment marks. The thin-film transistor layer may have a black masking layer that is patterned to form openings for display pixels. In a border area of the display that overlaps the ledge region, the thin-film transistor layer may have alignment mark viewing windows. Alignment marks formed from black masking material in the windows may be aligned with respective alignment marks on the components.

14 Claims, 12 Drawing Sheets

(56) References Cited

U.S. PATENT DOCUMENTS

| | | | |
|---|---|---|---|
| 2006/0279687 A1* | 12/2006 | Park | G02F 1/1333 349/142 |
| 2013/0265521 A1 | 10/2013 | Chen et al. | |
| 2014/0070081 A1 | 3/2014 | Spraggs et al. | |
| 2014/0146166 A1 | 5/2014 | Shin | |

* cited by examiner

DISPLAY WITH LOW REFLECTIVITY ALIGNMENT STRUCTURES

This application claims the benefit of provisional patent application No. 62/012,122, filed Jun. 13, 2014, which is hereby incorporated by reference herein in its entirety.

BACKGROUND

This relates generally to electronic devices, and more particularly, to electronic devices with displays.

Electronic devices often include displays. For example, cellular telephones and computers may have displays for presenting information to a user.

Liquid crystal displays contain a layer of liquid crystal material. Pixels in a liquid crystal display contain thin-film transistors and electrodes for applying electric fields to the liquid crystal material. The strength of the electric field in a pixel controls the polarization state of the liquid crystal material and thereby adjusts the brightness of the pixel.

Substrate layers such as color filter layers and thin-film transistor layers are used in liquid crystal displays. A thin-film transistor layer contains an array of the thin-film transistors and associated pixel electrodes that are used in controlling electric fields in the liquid crystal layer. A color filter layer contains an array of color filter elements such as red, blue, and green elements. The color filter layer provides the display with the ability to display color images.

In an assembled display, components are coupled to one or more of the substrate layers in the display. For example, in a display in which the thin-film transistor layer forms the outermost display layer of the display, the thin-film transistor layer may have a ledge region that extends past the edge of the color filter layer. Components such as a flexible printed circuit and display driver integrated circuit may be mounted to contacts in the ledge region, Alignment tolerances may be tight when mounting these components. As a result, it may be desirable to form mating alignment marks on the thin-film transistor layer and on the components being mounted to the thin-film transistor layer. If care is not taken, however, the alignment marks may be visible from the exterior of the display.

It would therefore be desirable to be able to provide improved alignment structures for displays such as liquid crystal displays.

SUMMARY

A display may have a thin-film transistor layer formed from a layer of thin-film transistor circuitry on a substrate. The thin-film transistor layer may overlap a color filter layer. A portion of the thin-film transistor layer may extend past the color filter layer to form a ledge region. Components such as a flexible printed circuit and a display driver integrated circuit may be mounted to the thin-film transistor layer in the ledge region. The display may be mounted in an electronic device housing for an electronic device.

The housing to which the display is mounted may have alignment marks. The components may also have alignment marks. The thin-film transistor layer may have a black masking layer that is patterned to form openings for display pixels. In the border of the display overlapping the ledge region, the thin-film transistor layer may have one or more alignment mark viewing windows. An alignment mark may be formed in each alignment mark viewing window from a portion of the black masking layer. The alignment mark in each alignment mark viewing window may be aligned, with a respective alignment mark on one of the components or on the housing.

DETAILED DESCRIPTION

Electronic devices may include displays. The displays may be used to display images to a user. Illustrative electronic devices that may be provided with displays are shown in FIGS. 1, 2, 3, and 4.

Figure 1:
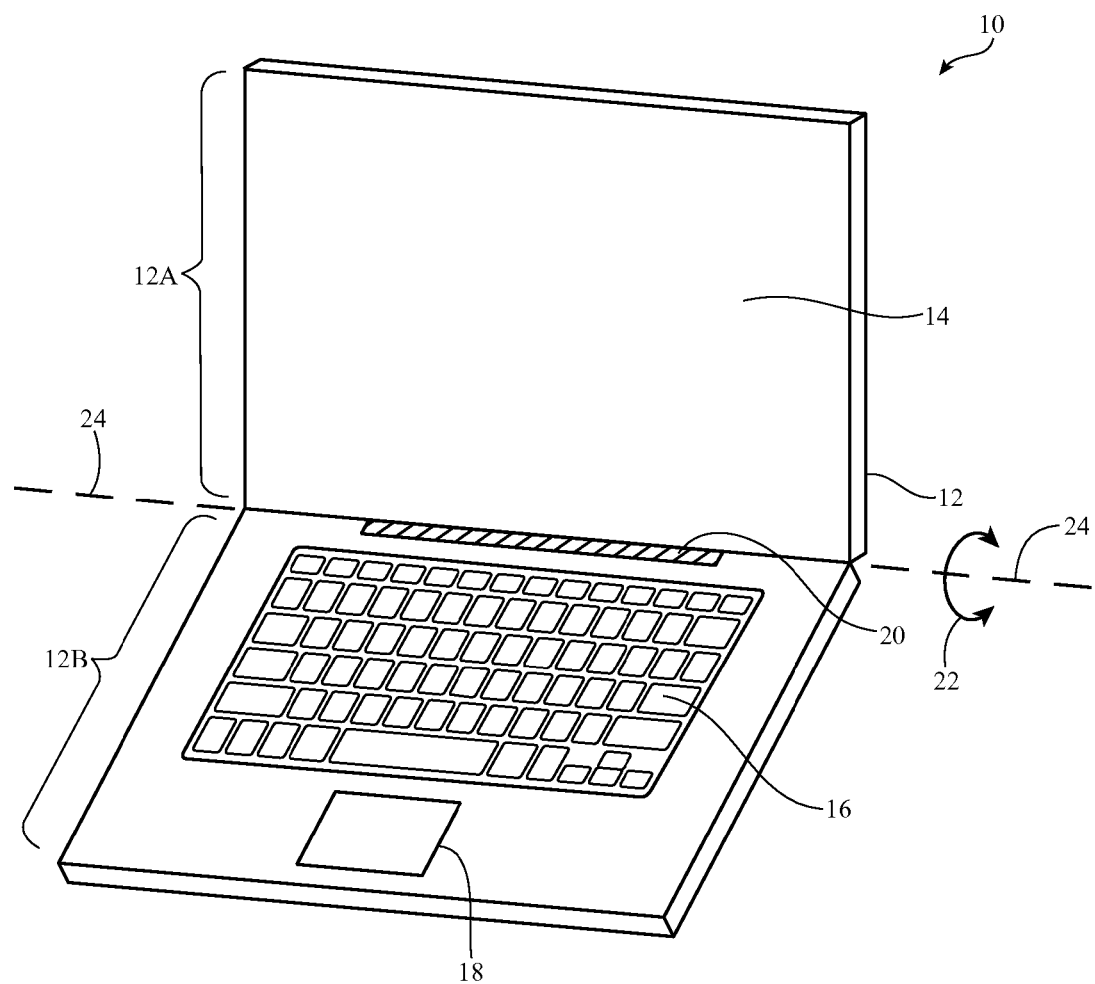
FIG. 1 is a perspective view of an illustrative electronic device such as a laptop computer with a display in accordance with an embodiment.

Illustrative electronic device 10 of FIG. 1 has the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lover housing 12B. Display 14 may be mounted in upper housing 12A. Upper housing 12A, which may sometimes be referred to as a display housing or lid, may be placed in a closed position by rotating upper housing 12A towards lower housing 12B about rotational axis 24.

Figure 2:
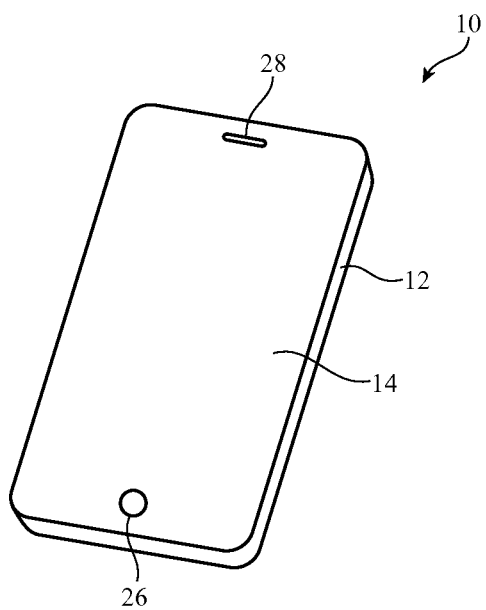
FIG. 2 is a perspective view of an illustrative electronic device such as a handheld electronic device with a display in accordance with an embodiment.

FIG. 2 shows how electronic device 10 may be a handheld device such as a cellular telephone, music player, gaming device, navigation unit. or other compact device. In this type of configuration for device 10, housing 12 may have opposing front and rear surfaces. Display 14 may be mounted on a front face of housing 12. Display 14 may. if desired, have openings for components such as button 26. Openings may also be formed in display 14 to accommodate a speaker port (see, e.g., speaker port 28 of FIG. 2).

Figure 3:
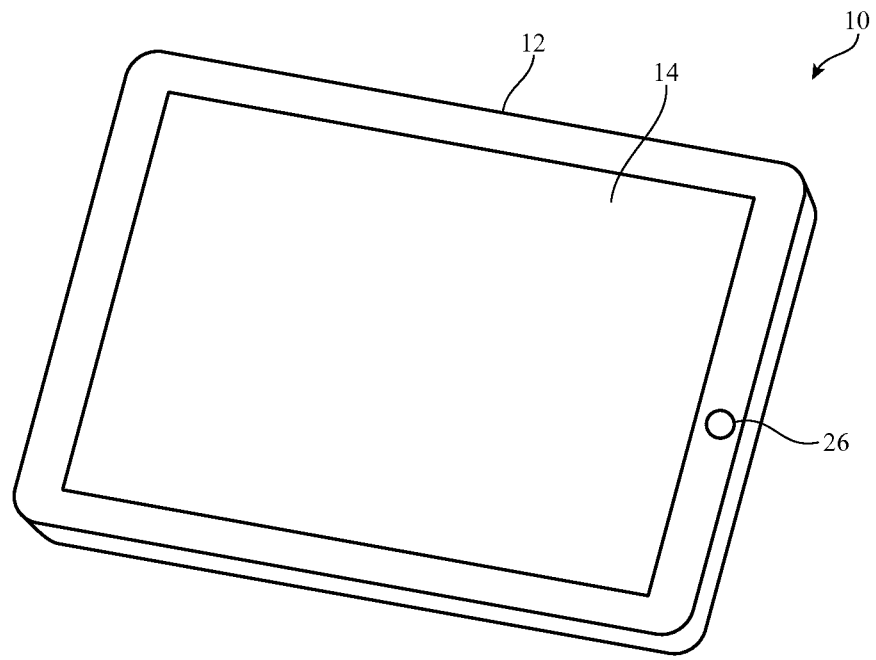
FIG. 3 is a perspective view of an illustrative electronic device such as a tablet computer with a display in accordance with an embodiment.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
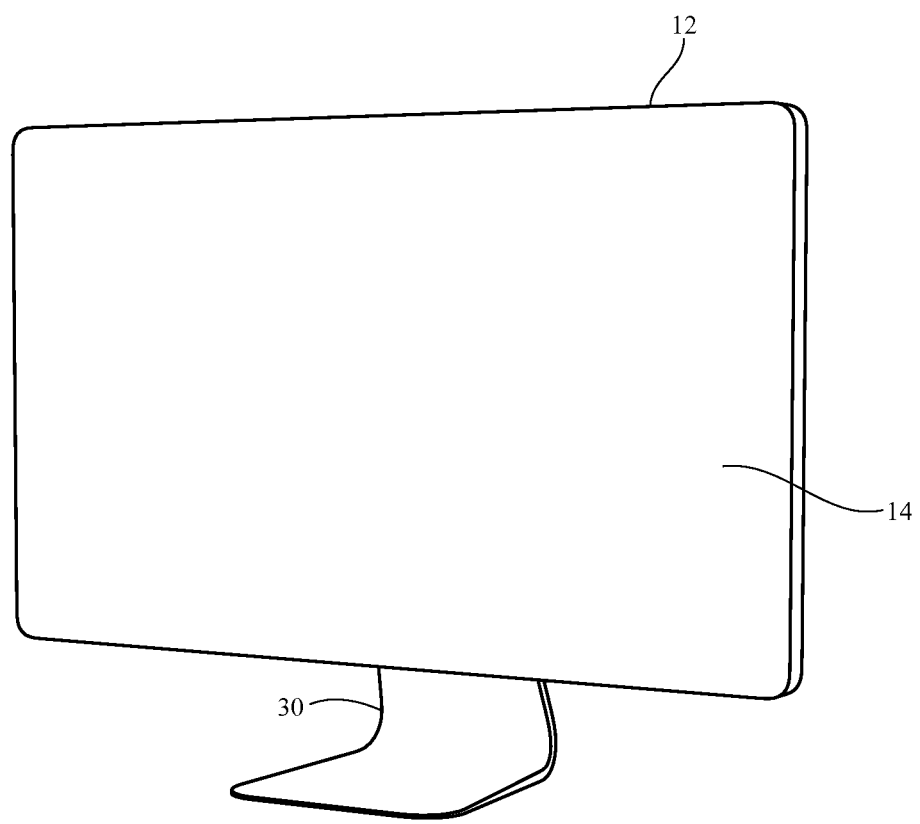
FIG. 4 is a perspective view of an illustrative electronic device such as a computer display with display structures in accordance with an embodiment.

FIG. 4 shows how electronic device 10 may be a computer display, a computer that has been integrated into a computer display, or a display for other electronic equipment. With this type of arrangement, housing 12 for device 10 may be mounted on a support structure such as stand 30 or stand 30 may be omitted stand 30 can be omitted when mounting device 10 on a wall). Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming de v ice, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 ma be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 may include display pixels formed from liquid crystal display (LCD) components or other suitable image pixel structures.

Figure 5:
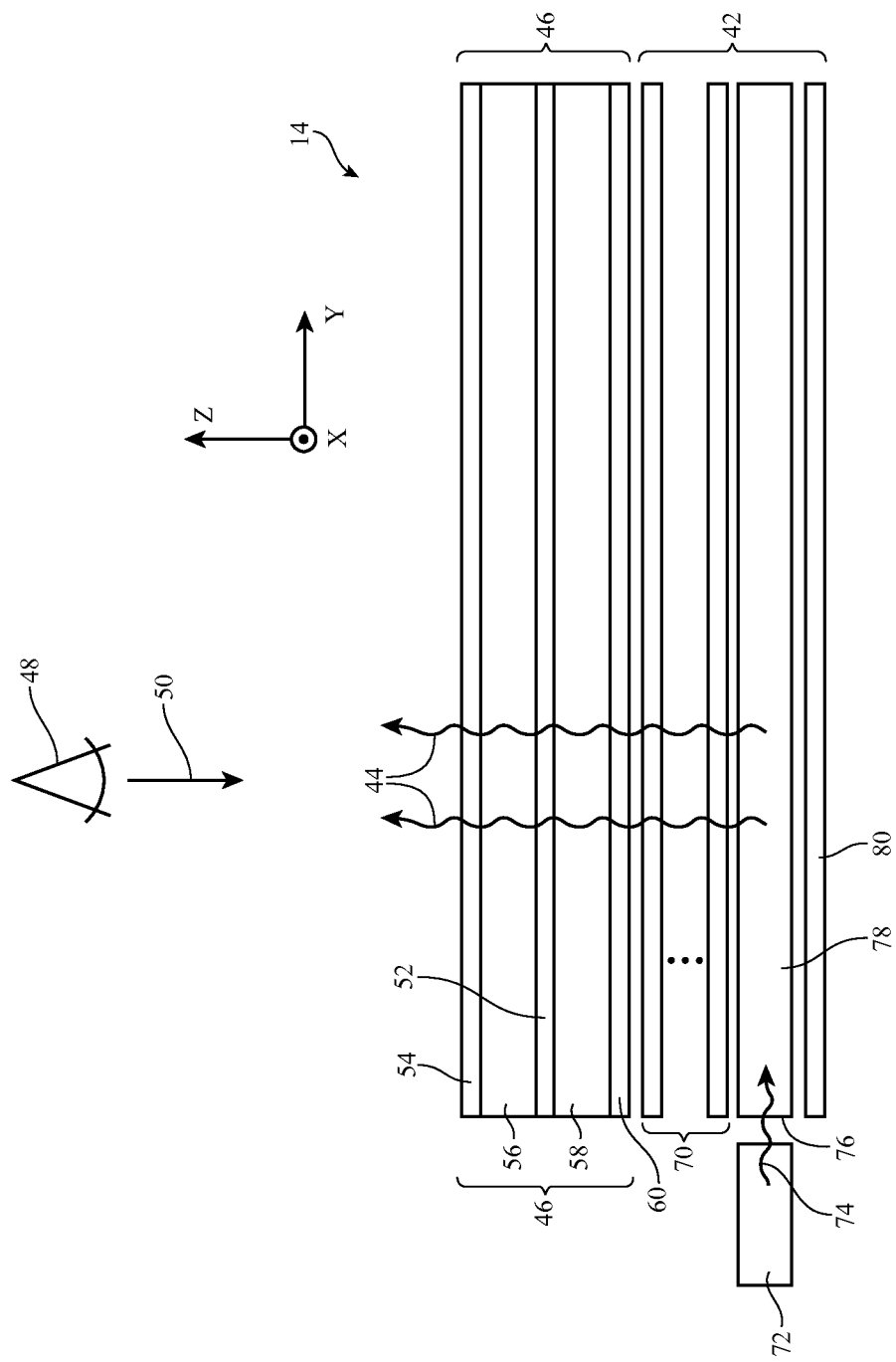
FIG. 5 is a cross-sectional side view of an illustrative display in accordance with an embodiment.

A display cover layer may cover the surface of display 14 or a display laser such as a thin-film transistor layer or other portion of a display may be used as the outermost (or nearly outermost) layer in display 14. The outermost display layer may be formed from a transparent glass sheet, a clear plastic layer, or other transparent member, A cross-sectional side view of an illustrative configuration for display 14 of device 10 (e.g., for display 14 of the devices of FIG. 1, FIG. 2, FIG. 3, FIG. 4 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z in the orientation of FIG. 5) and passes through display pixel structures in display layers 46. This illuminates any images that are being produced by the display pixels for viewing by a user. For example, backlight 44 may illuminate images on display layers 46 that are being viewed by user 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces. color filter elements, transistors, and other circuits and structures may be formed on the substrates of layers 58 and 56 (e.g., to form a thin-film transistor layer and/or a color filter layer). Touch sensor electrodes may also be incorporated into layers such as layers 56 and 58 and/or touch sensor electrodes may be formed on other substrates.

With one illustrative configuration. layer 56 may be a thin-film transistor layer that includes an array of thin-film transistors and associated electrodes (display pixel electrodes) for applying electric fields to pixel-sized portions of liquid crystal layer 52 and thereby displaying images on display 14. Layer 58 may be a color filter layer that includes an array of color filter elements for providing display 14 with the ability to display color images. If desired, upper layer 56 may be a color filter layer and lower layer 58 may be a thin-film transistor layer. Another illustrative configuration involves forming color filter elements and thin-film transistor circuits with associated pixel electrodes on a common substrate. This common substrate may be the upper substrate or may be the lower substrate and may be used in conjunction with an opposing glass or plastic layer (e.g., a layer with or without any color filter elements, thin-film transistors, etc.) to contain liquid crystal layer 52. Illustrative configurations for display 14 in which layer 56 is a thin-film transistor layer and layer 58 is a color filter layer are sometimes described herein as an example.

During operation of display 14 in device 10, control circuitry (e.g., one or more integrated circuits on a printed circuit) may be used to generate information to be displayed on display 14 (e.g., display data). The information to be displayed may be conveyed to one or more display driver integrated circuits and other display driver circuitry (e.g., thin-film gate drivers, etc.) using a signal path such as a signal path formed from conductive metal traces in a rigid or flexible printed circuit.

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be for example, an array of light-emitting diodes. If desired, light sources such as light source 72 may be located along multiple edges of light guide plate 78.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by a reflective film such as reflector 80. Reflector 80 may be formed from a reflective material such as a reflective layer of white plastic or other reflective materials.

To enhance backlight performance for backlight structures 42, backlight structures 42 may include optical films 70. Optical films 70 may include one or more diffuser layers for helping to homogenize backlight 44 and thereby reduce hotspots and one or more prism films (also sometimes referred to as turning films or brightness enhancement films) for collimating backlight 44. Compensation films for enhancing off-axis viewing may be included in optical films 70 or may be incorporated into other portions of display 14 (e.g., in polarizer layers such as layers 54 and/or 60). Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint.

Figure 6:
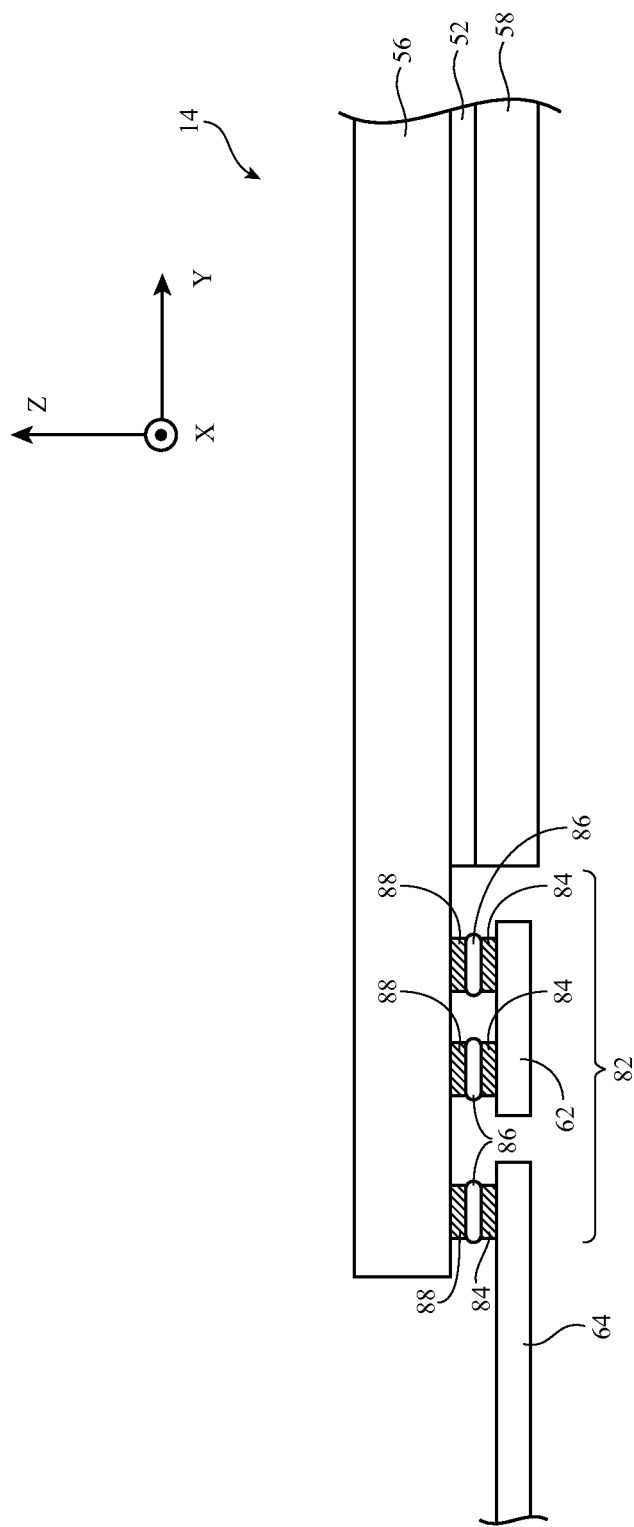
FIG. 6 is a cross-sectional side view of an illustrative display having a thin-film transistor layer ledge that overhangs the edge of a color filer layer in accordance with an embodiment.

As shown in the cross-sectional side view of FIG. 6, display 14 may have one or more display driver integrated circuits such as display driver integrated circuit 62. One of the peripheral edges of thin-film transistor layer 56 may extend past the edge of color filter layer 58, creating overhanging ledge region 82. In region 82, metal traces 88 may be exposed and may be patterned to form contacts. The metal layer in which metal traces 88 are formed may be, for example, a gate metal layer that is also used in forming gates for thin-film transistors in thin-film transistor layer 56. Other metal layers may also be present in the thin-film transistor circuitry of thin-film transistor layer 56.

Electrical components may be attached to thin-film transistor contacts 88 using conductive material 86 (e.g., conductive adhesive such as anisotropic conductive film, solder, etc.). For example, display driver integrated circuits such as display driver integrated circuit 62 may have contacts such as contacts 84 that mate with corresponding contacts 88 on thin-film transistor layer. Flexible printed circuit 64 may be used to route signals between a logic board in device 10 and display 14. Flexible printed circuit 64 may have copper or other metal that forms contacts 84 that mate with corresponding contacts 88 on thin-film transistor layer.

In order to properly mount components such as flexible printed circuit cable 64 and display driver integrated circuit 62 to thin-film transistor layer 56, the components should be aligned with respect to thin-film transistor layer 56. In particular, display driver integrated circuit 62 should be aligned so that contacts 84 on display driver integrated circuit 62 are aligned with respective contacts 88 on thin-film transistor layer 56 and flexible printed circuit 64 should be aligned so that contacts 84 on flexible printed circuit 64 are aligned with respective contacts 88 on thin-film transistor layer 56. Once aligned, these components can be mounted to thin-film transistor layer 56 (e.g., using heat and pressure to activate anisotropic conductive film or other conductive material 86). Satisfactory alignment may involve aligning contacts with an accuracy of about five to ten microns (as an example).

Figure 7:
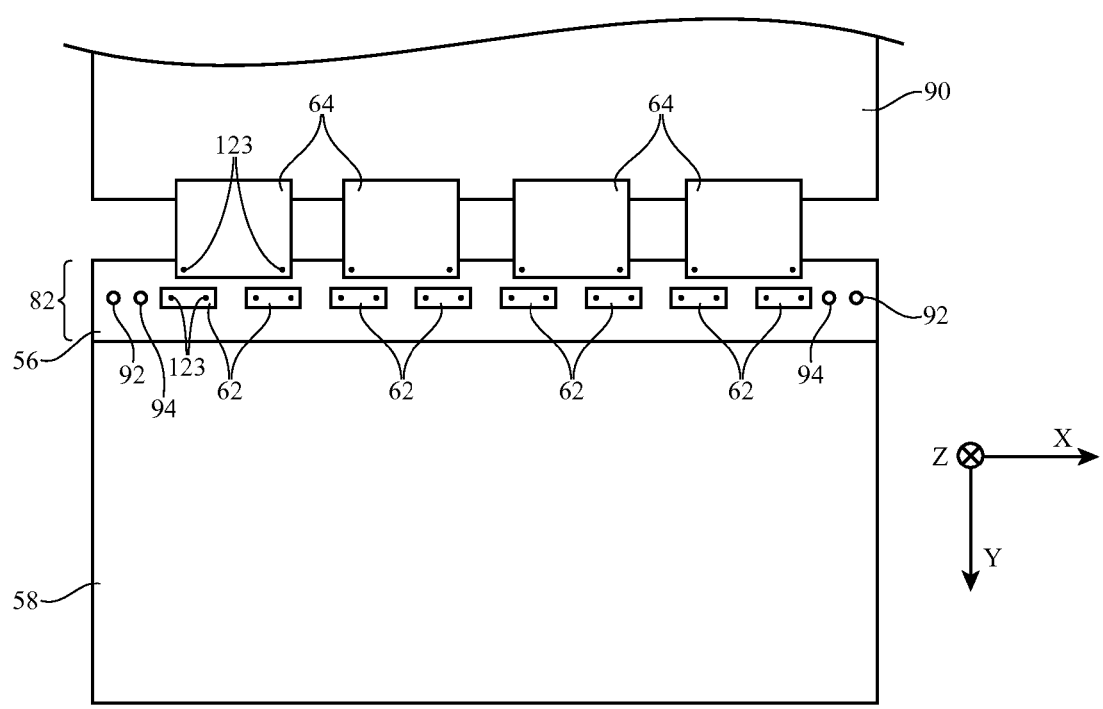
FIG. 7 is a top view of an illustrative display showing how flexible printed circuit cables may be used to route signals, between a logic board and the edge of the display in accordance with an embodiment.

FIG. 7 is a top view of display 14 showing lm multiple flexible punted circuits 64 may be arranged along an edge of display 14. In the example of FIG. 7, there are four flexible printed circuits 64 being used to route signals between circuitry on printed circuit hoard 90 and eight display driver integrated circuits 62 mounted to thin-film transistor layer 56 in ledge region 82. Other numbers of display driver integrated circuits and flexible printed circuits may be mounted to display 14, if desired.

Figure 8:
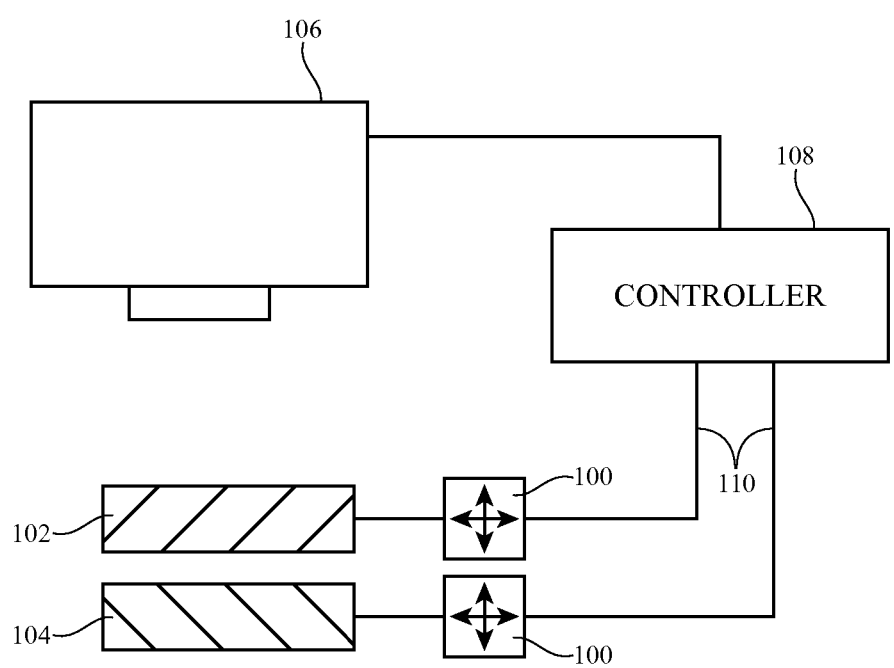
FIG. 8 is a side view of an illustrative system for aligning components such as display components with one another in accordance with an embodiment.

Display 14 may have alignment marks such as alignment marks 92 and 94 (e.g., marks on thin-film transistor layer 56 in region 82). Alignment marks 92 may be global alignment marks that are hidden under thin-film transistor layer black masking material (e.g., marks that are only visible from the underside of thin-film transistor layer 56). Marks 92 may be used to assist with alignment operations during edge grinding of glass substrate layers in display 14, during polarizer lamination, etc. Alignment marks 94 may be viewed from above thin-film transistor layer 56 (e.g., through the glass of layer 56 in direction 50 of FIG. 5) during alignment operations. Alignment marks 94 may be used in aligning display 14 to housing 12 or other device structures. Additional alignment marks (e.g., additional marks that are viewed from above layer 56) may be provided on thin-film transistor layer 56 and on components such as flexible printed circuits 64 and display driver integrated circuits 62 for use in aligning the components to thin-film transistor layer 56 in ledge region 82. These additional alignment marks are located under flexible printed circuits 64 and integrated circuits 62 in locations such as locations 123 and are visible when the structures of FIG. 7 are viewed in direction -Z, During alignment operations, manually adjusted stages and/or computer-controlled positioners such as positioners 100 may be used in controlling device structures such as structures 102 and 104 of FIG. 8. Structure 102 of FIG. 8 may be, for example, thin-film transistor layer 56. Structure 104 of FIG. 8 may be for example flexible printed circuit 64, display driver integrated circuit 62, and or housing 12. A camera such as camera 106 may capture images of structures 102 and 104 and alignment marks on structures 102 and 104. Controller 108 may process digital image data from camera 106 to determine the location of structures 102 and 104. Based on knowledge of the positions of structures 102 and 104 controller 108 can issue control commands on paths 110 that direct positioners 100 to adjust the positions of structures 102 and/or 104 and thereby align structures 102 and 104 with respect to each other. With one suitable arrangement, camera 106 may view structures 102 and 104 in display 14 in direction 50 (the -Z direction of FIGS. 5 and 6).

Figure 9:
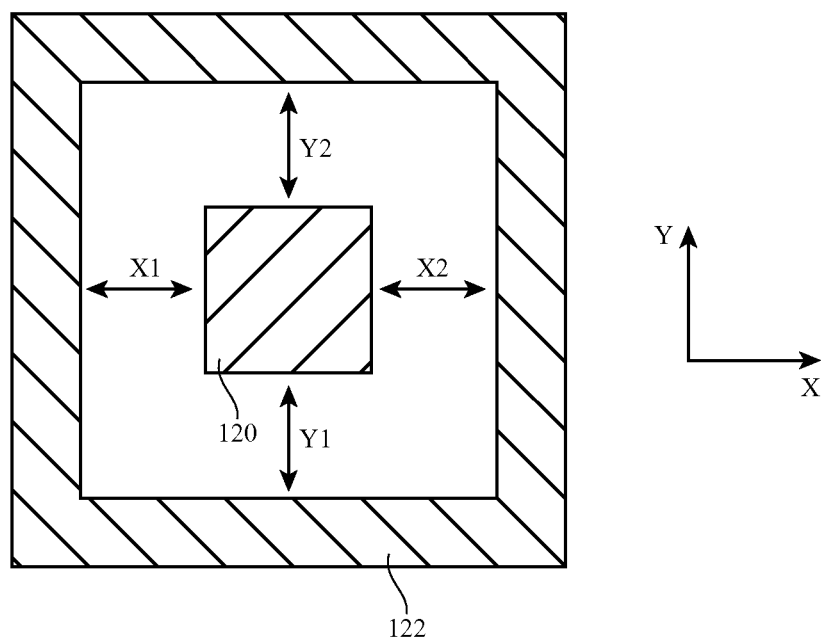
FIG. 9 is a top view of a pair of alignment marks in accordance with an embodiment.

An illustrative pair of associated alignment marks (sometimes referred to as alignment structures or alignment keys) is shown in FIG. 9. In the example of FIG. 9, first alignment mark 120 has the shape of a square and second alignment mark 122 has the shape of a rectangular ring that surrounds alignment mark 120. Other alignment mark configurations may be used if desired. The arrangement of FIG. 9 is merely illustrative.

Alignment marks 120 and 122 can be used to align structures with respect to each other. Alignment mark 120 may be attached to structure 102 of FIG. 8 (e.g., thin-film transistor layer 56) and alignment mark 122 may be attached to structure 104 (e.g., flexible pruned circuit 64, display driver integrated circuit 62, and/or housing 12) or vice versa. As shown in FIG. 9, alignment mark 120 is separated from adjacent portions of alignment mark 122 by horizontal separations X1 and X2 and by vertical separations Y1 and Y2. Mark 120 may be laterally aligned with respect to mark 122 may adjusting the positions of structures 102 and 104 relative to each other until X1 and X2 are equal (i.e., until structures 102 and 104 are horizontally aligned) and until Y1 and Y2 are equal (i.e., until structures 102 and 104 are vertically aligned).

Structures 104 (e.g., flexible printed circuit 64, display driver integrated circuit 62, and housing 12) may be opaque, thereby preventing the use of camera 106 or other visual inspection equipment to observe the relative positions of marks 120 and 122 from below thin-film transistor layer 56. As a result, alignment operations preferably involve the use of camera 106 (or other visual monitoring equipment) to observe the overlap and alignment of marks 120 and 122 from above (i.e., in direction 50 of FIG. 5). To ensure that alignment marks 120 and 122 are not blocked from view from above layer 56, alignment mark viewing openings may be formed in the black masking layer of thin-film transistor layer 56. In the active area of display 14, the black masking layer is patterned to turn a grid with openings for the pixels of display 14. This grid, which is sometimes referred to as a black matrix, is positioned so that the openings overlap respective color filter elements in color filter layer 58. In the inactive border area of display 14 (e.g., in region 82), the black masking layer form an opaque border that blocks stray backlight 44 and prevents user 48 from viewing internal components under thin-film transistor layer 56. Alignment mark viewing windows may be formed in the black masking layer to permit alignment marks 120 and 122 to be viewed (e.g., to allow lower alignment mark 122 to be viewed through the clear substrate of layer 56 relative to upper mark 120).

Figure 10:
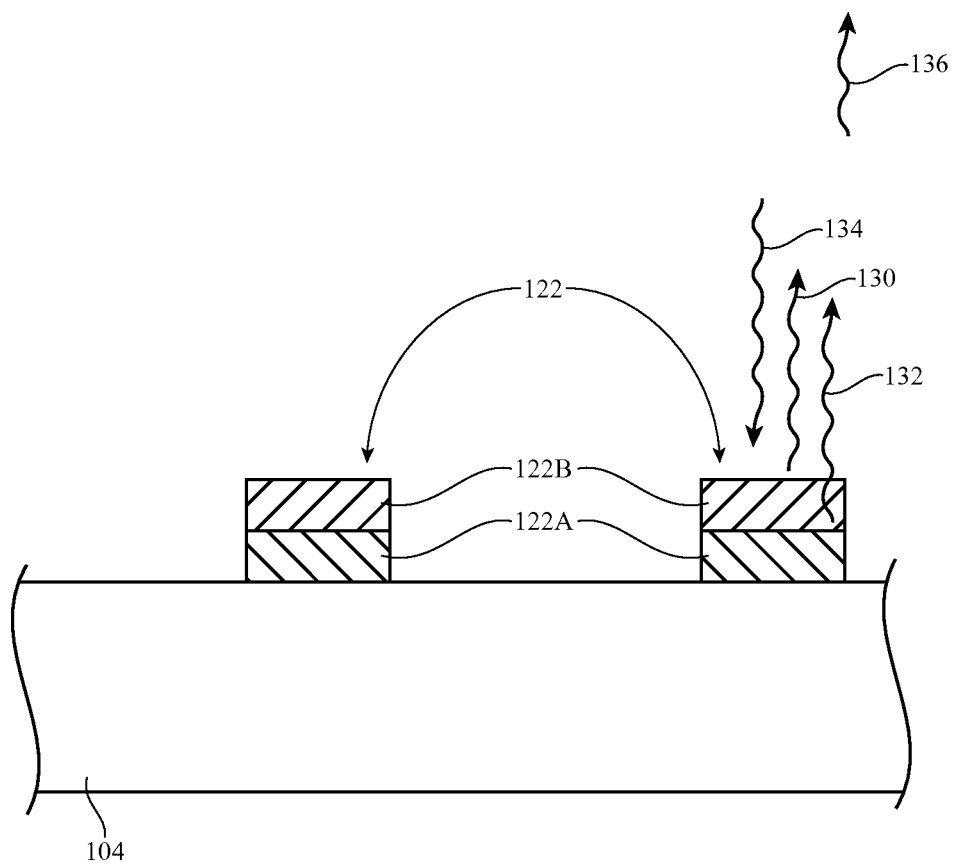
FIG. 10 is a side view of an illustrative alignment mark in accordance with an embodiment.

To prevent the alignment marks from being noticeable to a user of device 10, it may be desirable to minimize the reflectivity of marks 120 and/or 122. Mark 120 may, for example, be formed from a patterned portion of the black masking layer on the underside of thin-film transistor layer 56, rather than a more reflective material such as metal. Mark 122 may be formed from metal (e.g., copper), a low-reflectivity metal (e.g., a metal with a reflectivity that is less than copper such as molybdenum or titanium), polymer, metal coated with polymer or other dielectric. dielectric materials, or other suitable materials. As shown in FIG. 10, mark 122 may, if desired, be formed from a lower layer 122A and an upper layer 122B. Lower layer 122A may be metal (e.g., copper). Upper layer 122B may be a dielectric, The dielectric of layer 122B may be transparent and may have a relatively high index of refraction (e.g., an index of refraction greater than 2.0). Examples of dielectrics with high index of refraction values are metal oxides (e.g., titanium oxide). The relatively high index of refraction of layer 122B gives rise to a large index discontinuity as light 134 travels from surrounding air into layer 122B, thereby creating relatively large amounts of reflected light 130 from the upper surface of layer 122B. Light 130 and light 132 that has reflected from the surface of metal layer 122A destructively interfere with each other, thereby reducing the overall amount of light 136 reflected from mark 122 and thereby reducing the visibility of mark 122 to user 48.

Figure 11:
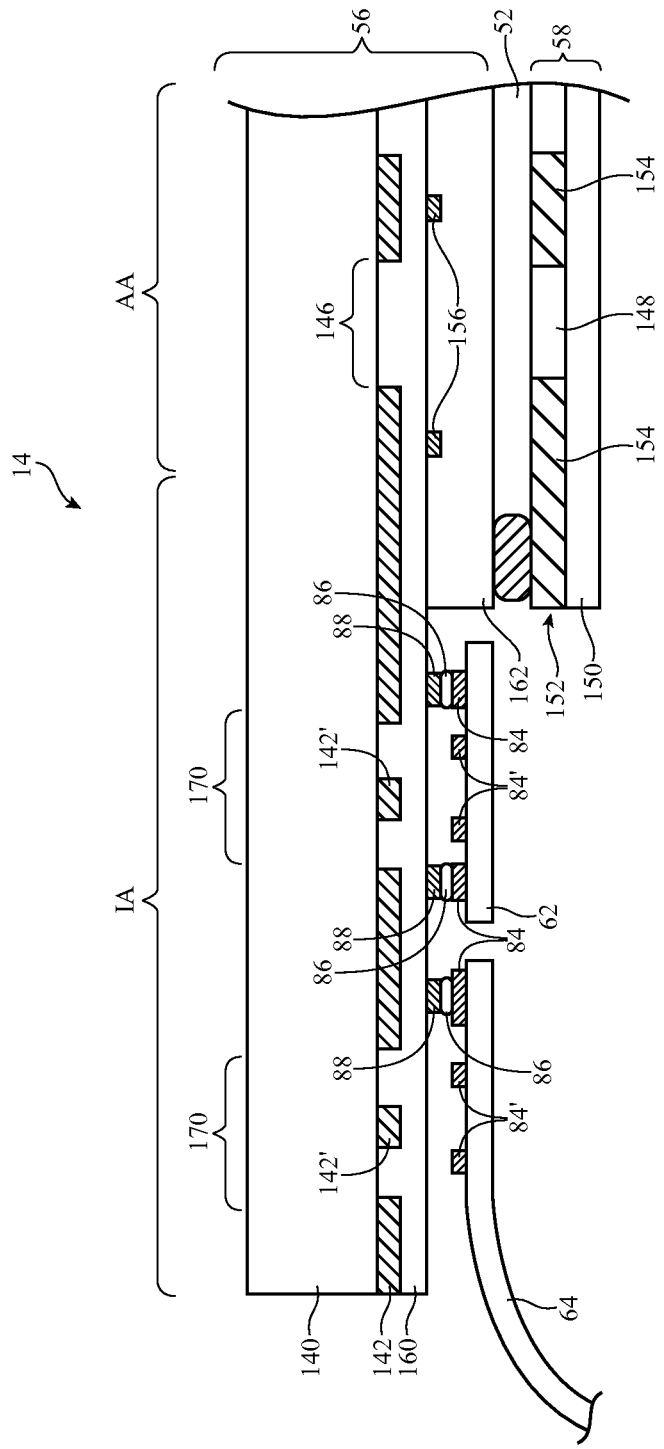
FIG. 11 is a cross-sectional side view of an illustrative display in which components have been aligned with the display before attaching the components to the display in accordance with an embodiment.

A cross-sectional side view of display 14 in the vicinity of region 82 is shown in FIG. 11. As shown in FIG. 11, thin-film transistor layer 56 may have a clear substrate such as substrate 140 (e.g., a glass substrate). Black masking material 142 (sometimes referred to as thin-flint transistor layer black masking material 142) or other opaque masking material is used to form an opaque border in inactive area IA of display 14 and is used to form a black matrix with openings 146 in active area AA. Black masking material 142 may be formed from photoimageable polymer with an opaque additive such as carbon black. Each opening 146 is associated with a pixel in display 14 and overlaps a respective color filter element 148 in color filter layer 58. Color filter layer 58 includes a substrate such as clear substrate 150 (e.g., a glass substrate). Color filter array 152 is formed on the surface of substrate 150. Color filter array 152 contains an array of color filter elements 148 (e.g., red, green, and blue elements, etc.) and black matrix 154 Black matrix 154 has openings to accommodate respective color fitter elements 148. Sealant 156 retains liquid crystal layer 52 between color filter layer 58 and thin-film transistor layer 56.

Thin-film transistor layer 56 has dielectric layers such as layers 160 and 162. Layer 160 may be for example, a planarization layer that is formed from a spin-on glass such as a silicon oxide based spin-on glass (e.g., a silicate spin-on glass) or other silicate layer. Layer 162 and other dielectric layers in thin-film transistor layer 56 may be formed from inorganic dielectrics such as silicon oxide, silicon nitride, layers of other dielectric materials, and combinations of these materials (as examples). Thin-film transistor layer 56 also has patterned metal layers (e.g., layers that are patterned to form interconnects and structures for thin-film transistors). The active regions of the thin-film transistors in thin-film transistor layer 56 may be formed from patterned semiconductor layers (e.g., patterned layers of silicon, semiconducting oxides such as indium gallium zinc oxide, or other semiconductor layers for forming thin-film transistors). The layers of metal, dielectric, and semiconductor that form the thin-film transistor circuitry of layer 56 can be formed on the underside of substrate 140.

Thin-film transistor layer 56 has a metal layer that is used in forming pixel electrodes in alignment with each black matrix opening 146 in active area AA. Thin-film transistor layer 56 also has a layer of patterned gate metal 156 for forming thin-film transistor circuitry such as thin-film transistor gates under portions of black masking layer 142 in active area AA. In inactive area IA patterned portions of the same layer of gate metal or other metal layer in thin-film transistor layer 56 may be used to form thin-film transistor layer contacts 88 that mate with corresponding component contacts 84. Component contacts 84 may be formed from copper or other metal in components such as flexible printed circuit 64 and display driver integrated circuit 62. Patterned portions of the same metal layer that is used in forming contacts 84 on a component may be used in forming alignment mark structures 84' on the component. Alignment mark structures 84' may, for example, be used in forming alignment marks such as alignment mark 122 of FIG. 9 or alignment marks of other suitable shapes. Alignment marks such as these, which are formed on a surface of a component that is being attached to thin-film transistor layer 56 may sometimes be referred to as component alignment marks, component alignment structures, or component alignment keys.

As shown in FIG. 11, black masking layer 142 may have alignment mark viewing openings such as alignment mark openings 170 to allow camera 106 or other equipment to vies the component alignment marks (e.g., marks 122 of FIG. 9). A portion of black masking layer 142 such as patterned portions 142' in FIG. 11 may be used in forming thin-film transistor alignment marks such as alignment marks 120 of FIG. 9 (also sometimes referred to as thin-film transistor alignment structures or alignment keys). Black mask alignment mark structures 142' may be formed in the center of alignment mark openings 170 or may be formed elsewhere in openings 170.

Black masking material 142 may be formed from a material that has a to reflectivity (e.g., photoimageable polymer with an additive such as carbon black or other black material). As a result, thin-film alignment marks formed from structures 142' will tend to reflect small amounts of light. This helps hide the alignment marks formed from structures 142' from view. even though no intervening structures help prevent structures 142' from being observed by a user. Alignment mark structures 84' may also be configured to exhibit reduced reflectivity values (e.g., by using a low reflectivity metal for structures 84', by coating a metal such as copper with a low reflectivity metal, by coating a metal such as copper with an organic layer (e.g., a polymer layer) that reduces reflectivity, or by coating copper or other metals with a high-index-of-refraction dielectric such as metal oxide, as described in connection with FIG. 9.

Figure 12:
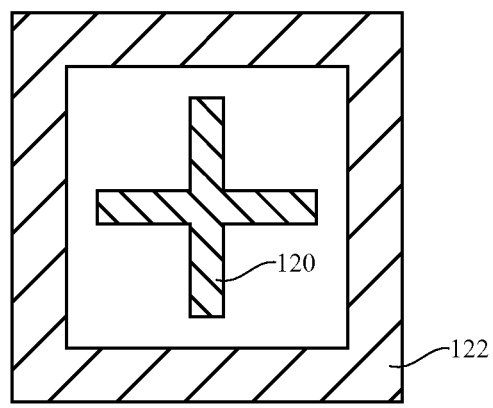
FIG. 12 is a top view of an illustrative pair of alignment marks including a cross-shaped inner alignment mark and a rectangular ring-shaped outer alignment mark in accordance with an embodiment.
Figure 13:
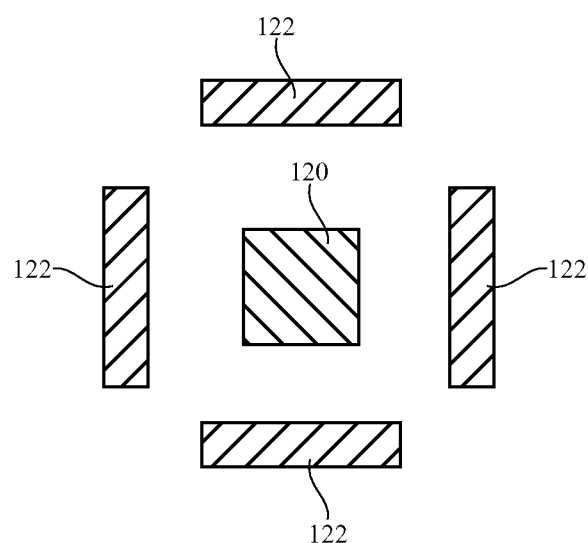
FIG. 13 is a top view of an illustrative pair of alignment marks including a square inner alignment mark and a set of surrounding outer bar-shaped structures in an outer alignment mark in accordance with an embodiment.

As shown in FIG. 12, alignment structures for display 14 may include cross-shaped alignment structures such as illustrative alignment mark 122 and may include rectangular ring-shaped alignment structures such as illustrative alignment mark 120. In the example of FIG. 13, alignment mark 122 has been formed from segmented portions of a rectangular ring that surround mark 120. The removal of portions of the ring may help reduce reflections from alignment mark 122 of FIG. 13. Other shapes and sizes may be used for alignment marks 120 and 122, if desired. Marks 120 and 122 may, in general, be formed from polymer or other dielectric, metal, black masking material or other opaque masking, material, metal oxides, multi-layer stacks of these materials and/or other materials, or other materials. Mark 120 (or mark 122) may be the inner mark or may be the outer mark in a configuration in which one alignment mark surrounds another or other alignment mark arrangements may be used.

Figure 14:
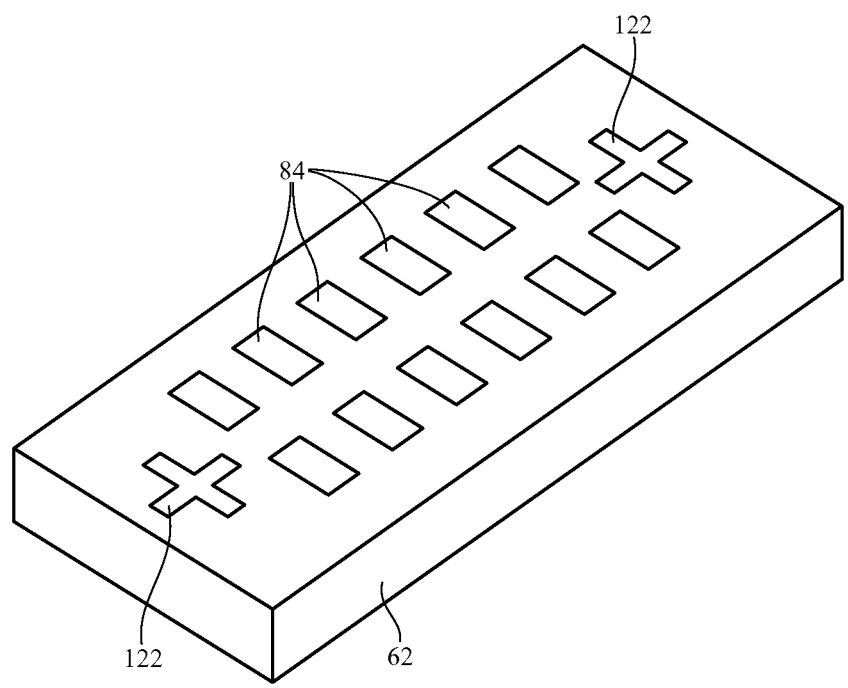
FIG. 14 is a perspective view of an inner surface of a display driver integrated circuit with contact pads and a pair of alignment marks in accordance with an embodiment.

FIG. 14 is a perspective view of the underside of an illustrative display driver integrated circuit. As shown in FIG. 14 display driver integrated circuit 62 may have contacts, 84 (e.g., copper contacts, etc.) and alignment marks 122 (e.g., alignment marks formed using the same metal as contacts 84 such as metal 84' of FIG. 13, metal 84' that has been coated with optional additional layers to reduce reflectivity, etc.). There are two alignment marks 122 on display driver integrated circuit 62. If desired, fewer than two marks or more than two marks may be used.

The foregoing is merely illustrative and various modifications can be made by those skilled in the art without departing from the scope and spirit of the described embodiments. The foregoing embodiments may be implemented individually or in any combination.

What is claimed is:
1. A display, comprising:
an upper polarizer;
a lower polarizer;
a layer of liquid crystal material;
a thin-film transistor layer between the layer of liquid crystal material and the upper polarizer, wherein the thin-film transistor layer has a thin-film transistor layer alignment mark formed from a layer of black masking material;
a color filter layer between the layer of liquid crystal material and the lower polarizer; and
a display driver integrated circuit mounted on the thin-film transistor layer, wherein the display driver integrated circuit has a patterned metal layer that forms contacts that are electrically shorted to the thin-film transistor layer and that forms a display driver integrated circuit alignment mark that is aligned with the thin-film transistor layer alignment mark.

2. The display defined in claim 1 further comprising:
backlight structures, wherein the lower polarizer is located between the backlight structures and the color filter layer.

3. The display defined in claim 1 further comprising:
a flexible printed circuit.

4. The display defined in claim 3 wherein the flexible printed circuit has a patterned metal layer that forms contacts and that forms a component alignment mark on the flexible printed circuit.

5. The display defined in claim 1 wherein the metal of the display driver integrated circuit alignment mark has a reflectivity less than copper.

6. The display defined in claim 1 wherein the display driver integrated circuit alignment mark comprises a metal oxide on the metal.

7. The display defined in claim 1 wherein the display driver integrated circuit alignment mark comprises a dielectric layer on the metal.

8. The display defined in claim 1 wherein the thin-film transistor alignment mark has a square shape and wherein the display driver integrated circuit alignment mark at least partly surrounds the square.

9. Apparatus, comprising:
a thin-film transistor substrate layer;
a patterned black masking layer on the thin-film transistor substrate layer;
a layer of dielectric covering the patterned black masking layer;
an alignment mark viewing window formed from an opening in the patterned black masking layer; and
an alignment mark in the alignment mark viewing window that is formed from a portion of the patterned black masking layer.

10. The apparatus defined in claim 9 wherein the layer of dielectric comprises silicate spin-on glass, the apparatus further comprising:
a layer of thin-film transistor circuitry on the silicate spin-on glass.

11. The apparatus defined in claim 10 further comprising an alignment mark that is aligned with the alignment mark formed from the portion of the patterned black masking layer.

12. The apparatus defined in claim 11 further comprising an integrated circuit, wherein the alignment mark that is aligned with the alignment mark formed from the portion of the patterned black masking layer is formed on the integrated circuit.

13. A display, comprising:
a thin-film transistor layer with a layer of black masking material having at least one opening that forms an alignment mark viewing window and having a portion in the opening that forms a black masking layer alignment mark; and a transparent substrate layer, wherein the thin-film transistor layer has an edge that extends past an edge of the transparent substrate layer to form a ledge region in which the alignment mark viewing window is located.

14. The display defined in claim 13 further comprising an electrical component mounted to the thin-film transistor layer in the ledge region, wherein the electrical component has an alignment mark that is aligned with the black masking layer alignment mark.

* * * * *

UNITED STATES PATENT AND TRADEMARK OFFICE
CERTIFICATE OF CORRECTION

PATENT NO. : 9,595,497 B2  
APPLICATION NO. : 14/494529  
DATED : March 14, 2017  
INVENTOR(S) : Byung Duk Yang et al.

Page 1 of 1

It is certified that error appears in the above-identified patent and that said Letters Patent is hereby corrected as shown below:

On the Title Page

In the abstract, Line 5, "to for a ledge region" should read --to form a ledge region--.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*